(12) United States Patent
Peng et al.

(10) Patent No.: US 10,757,804 B1
(45) Date of Patent: Aug. 25, 2020

(54) FLEXIBLE HYBRID ELECTRONIC SYSTEM AND METHOD OF REDUCING THE IMPACT THEREOF

(71) Applicant: Industrial Technology Research Institute, Hsinchu (TW)

(72) Inventors: Yu-Ming Peng, Taichung (TW); Kuan-Chu Wu, Kaohsiung (TW); Kai-Ming Chang, New Taipei (TW); Chen-Tsai Yang, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/815,031

(22) Filed: Mar. 11, 2020

(30) Foreign Application Priority Data

Dec. 18, 2019 (TW) .............................. 108146402 A (51) Int. Cl.
*H05K 1/11* (2006.01)
*H05K 1/02* (2006.01)
*H01L 23/498* (2006.01)

(52) U.S. Cl.
CPC ....... *H05K 1/0283* (2013.01); *H01L 23/4985* (2013.01); *H01L 23/49838* (2013.01); *H05K 2201/0133* (2013.01)

(58) Field of Classification Search
CPC .......... H05K 1/0283; H05K 2201/0133; H01L 23/49838; H01L 23/4985
USPC ....................................................... 174/254
See application file for complete search history.

(56) References Cited

U.S. PATENT DOCUMENTS

2012/0052268 A1   3/2012   Axisa et al.

FOREIGN PATENT DOCUMENTS

| CN | 103872002 | 6/2014 |
| TW | 200839999 | 10/2008 |

*Primary Examiner* — Tremesha S Willis
(74) *Attorney, Agent, or Firm* — JCIPRNET (57) ABSTRACT

A flexible hybrid electronic (FHE) system includes a carrier, a first redistribution structure on the carrier, a first device on the first redistribution structure, and an encapsulation layer encapsulating the first device. The carrier has a first Young's modulus Y1. The first redistribution structure has a second Young's modulus Y2. The first device and a portion of the encapsulation layer form a top surface of the first redistribution structure to a top surface of the first device is a first portion having a third Young's modulus Y3. The other portion of the encapsulation layer from the top surface of the first device to a top surface of the encapsulation layer is a second portion having a fourth Young's modulus Y4. A ratio of Y3/Y4 is between 1.62 and 1.98; a ratio of Y3/Y2 is between 0.18 and 0.22; and a ratio of Y3/Y1 is between 280.62 and 342.98.

20 Claims, 9 Drawing Sheets

FLEXIBLE HYBRID ELECTRONIC SYSTEM AND METHOD OF REDUCING THE IMPACT THEREOF

CROSS-REFERENCE TO RELATED APPLICATION

This application claims the priority benefit of Taiwan application no. 108146402, filed on Dec. 18, 2019. The entirety of the above-mentioned patent application is hereby incorporated by reference herein.

TECHNICAL FIELD

The disclosure relates to an electronic device and a method of reducing impact of the electronic device, and relates to a flexible hybrid electronic system and a method of reducing impact of the flexible hybrid electronic system.

BACKGROUND

Flexible hybrid electronics (FHE) devices are flexible and applicable to wearable devices, smart patches, smart garment, or in-vehicle systems as a type of electronic component that has attracted much attention. However, in a flexible hybrid electronic packaging structure, each device structure has different characteristics, and the stress on each device in the system is different according to the user's application field/wearing method and impact force. Therefore, a reliability of this type of product is not easy to control, and the product is prone to damages.

SUMMARY

According to one embodiment of the disclosure, a flexible hybrid electronic system is proposed and includes: a first redistribution structure, disposed on a first region of a carrier, wherein the carrier has a first thickness T1 and a first Young's modulus Y1, and the first redistribution structure has a second thickness T2 and a second Young's modulus Y2; a first device, disposed on the first redistribution structure; an encapsulation layer, encapsulating the first device, and covering the first device and the first redistribution structure, wherein the first device and a portion of the encapsulation layer from a top surface of the first redistribution structure to a top surface of the first device is a first portion having a third thickness T3 and having a third Young's modulus Y3, and another portion of the encapsulation layer from the top surface of the first device to a top surface of the encapsulation layer is a second portion having a fourth thickness T4 and having a fourth Young's modulus Y4, wherein a ratio of Y3/Y4 is between 1.62 and 1.98; a ratio of Y3/Y2 is between 0.18 and 0.22; and a ratio of Y3/Y1 is between 280.62 and 342.98.

According to another embodiment of the disclosure, a flexible hybrid electronic system is proposed and includes: a first redistribution structure, disposed on a first region of a carrier; a first device, disposed on the first redistribution structure; a first encapsulation layer, encapsulating the first device, and covering the first device and the first redistribution structure; a first material layer covering the first encapsulation layer, the first material layer having a first thickness T1' and a first Young's modulus Y1'; a second material layer, covering the first material layer, the second material layer having a second thickness T2' and a second Young's modulus Y2', wherein the first device and a portion of the first encapsulation layer from a top surface of the first redistribution structure to a top surface of the first device is a first portion, and the first portion has a third thickness T3 and has a third Young's modulus Y3, wherein a ratio of Y3/Y2' is between 0.18 and 0.22; a ratio of Y3/Y1' is between 280.62 and 342.98; a ratio of T3/T2' is between 2.34 and 2.86; and a ratio of T3/T1' is between 0.72 and 0.88.

According to yet another embodiment of the disclosure, a method of reducing impact of a flexible hybrid electronic system is proposed. The flexible hybrid electronic system includes: at least one device, disposed on a plurality of regions of a carrier; a plurality of redistribution structures, respectively disposed between the carrier and the at least one device; and an encapsulation layer, encapsulating the at least one device, and covering the at least one device and the redistribution structures. The method includes: using a first device having a highest top surface among the at least one device as a reference, wherein the carrier below the first device has a first thickness T1 and a first Young's modulus Y1, and a first redistribution structure between the first device and the carrier has a second thickness T2 and a second Young's modulus Y2; defining the first device and a portion of the encapsulation layer from a top surface of the first redistribution structure to a top surface of the first device as a first portion, the first portion having a third thickness T3 and having a third Young's modulus Y3; defining another portion of the encapsulation layer from the top surface of the first device to a top surface of the encapsulation layer as a second portion, the second portion having a fourth thickness T4 and having a fourth Young's modulus Y4; adjusting Y1, Y2, Y3 and Y4 so that a ratio of Y3/Y4 is between 1.62 and 1.98; a ratio of Y3/Y2 is between 0.18 and 0.22; and a ratio of Y3/Y1 is between 280.62 and 342.98; and adjusting T1, T2, T3 and T4 so that a ratio of T3/T4 is between 1.98 and 2.42; a ratio of T3/T2 is between 2.34 and 2.86; and a ratio of T3/T1 is between 0.72 and 0.88.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
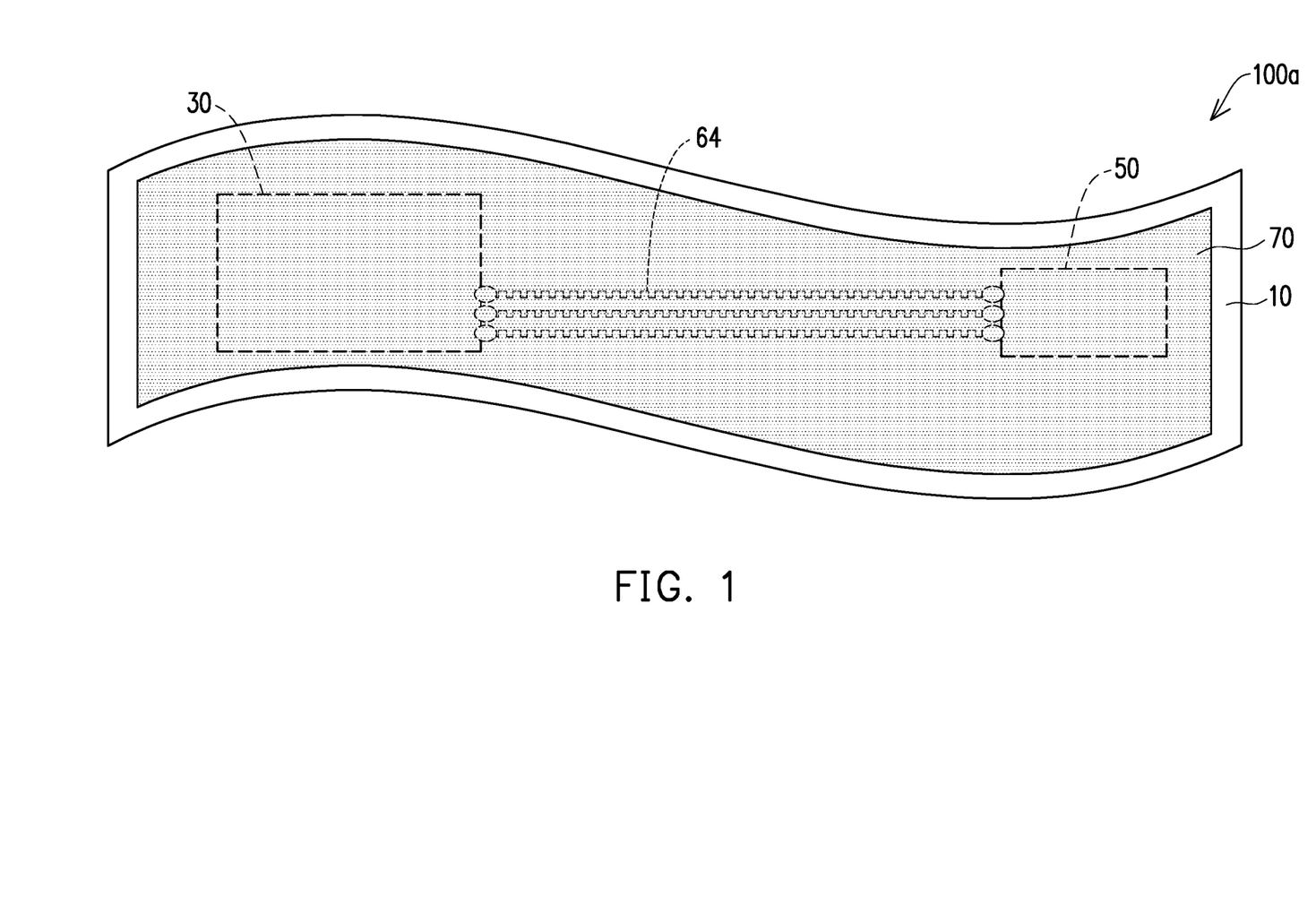
FIG. 1 is a top view of a flexible hybrid electronic system illustrated according to one embodiment of the disclosure.
Figure 2A:
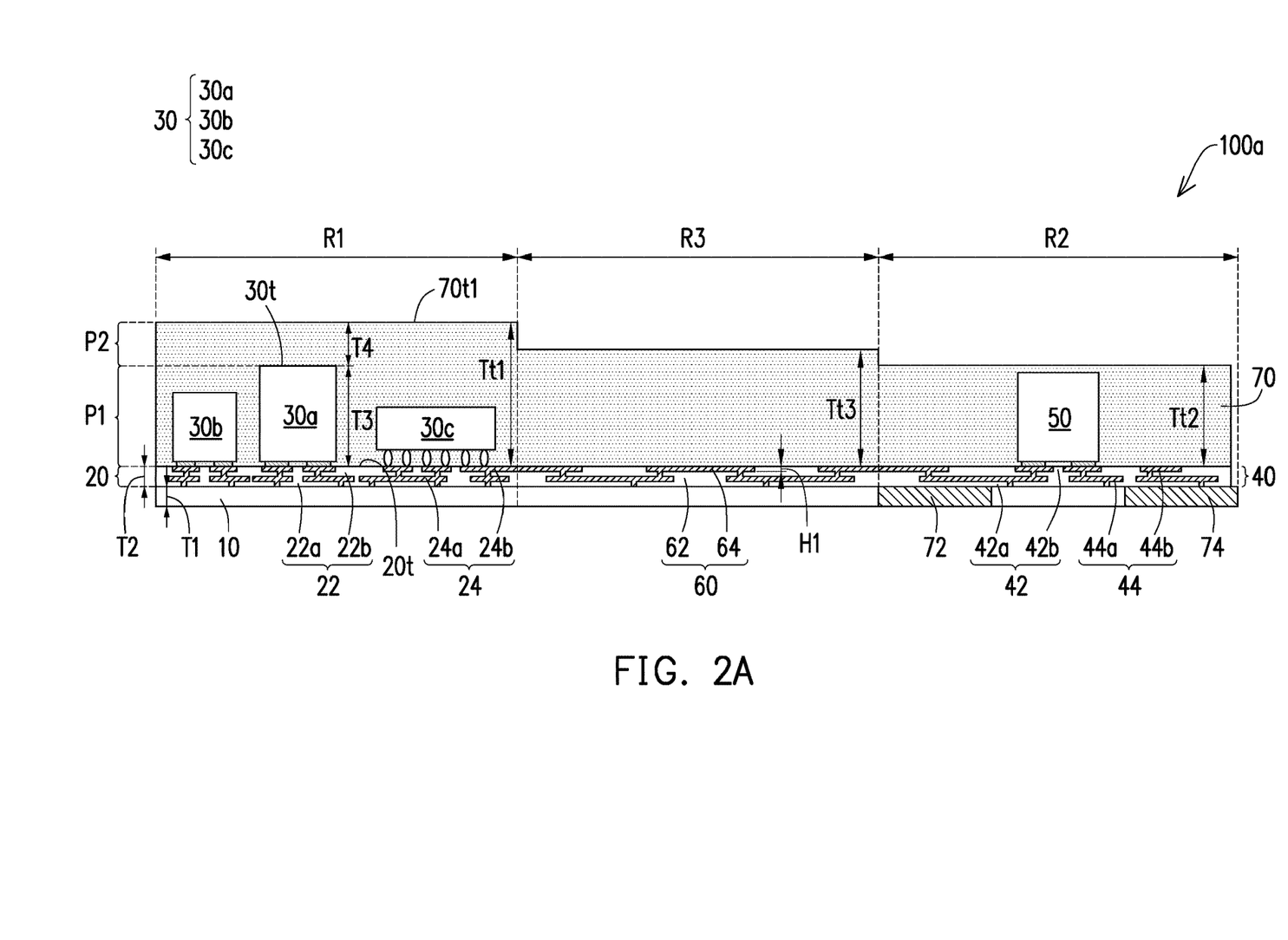
FIG. 2A, FIG. 2B, FIG. 3 to FIG. 8 are cross-sectional views of a flexible hybrid electronic system respectively illustrated according various embodiments of the disclosure.
Figure 2B:
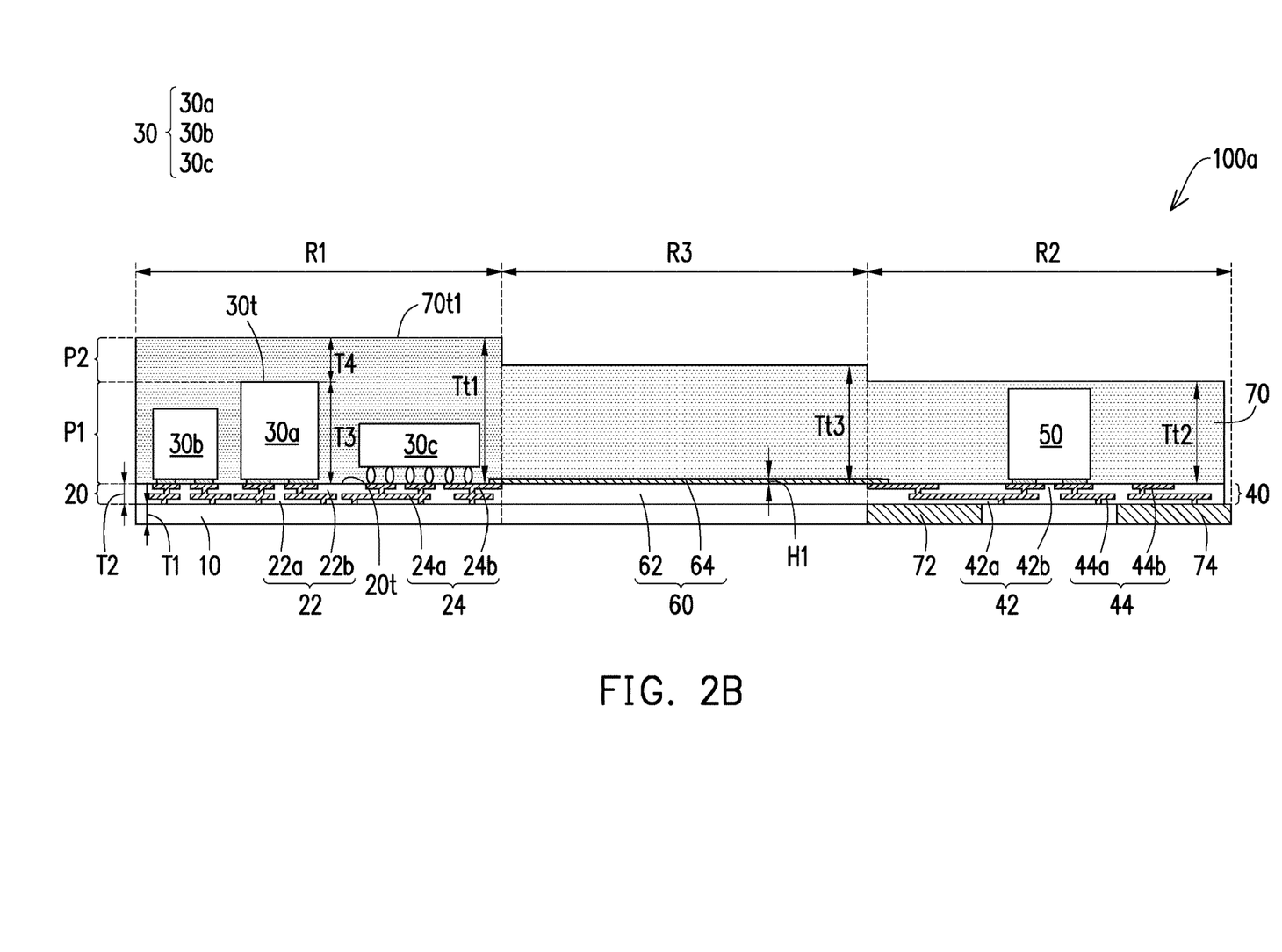

FIG. 1 illustrates a top view of a flexible hybrid electronic system. FIGS. 2A and 2B illustrate a cross-sectional view of a flexible hybrid electronic system.

Referring to FIGS. 1, 2A and 2B, a flexible hybrid electronic system 100a includes a carrier 10. The carrier 10 may be, for example, a flexible substrate. The carrier 10 may be a single layer or multiple layers. The carrier 10 may be composed of a single material or multiple materials. The carrier 10 has a first thickness T1 and a first Young's modulus Y1. A range of the first thickness T1 is, for example, 1.25 mm to 3.12 mm. A range of the first Young's modulus Y1 is, for example, 0.02 GPa to 0.27 GPa. By changing the material, the composition, the number of layers, or the configuration of the carrier 10, the first Young's modulus Y1 may be adjusted to the above range.

The carrier 10 includes an organic material (or referred to as polymer). The organic material is, for example, one of polyimide (PI), poly(methyl methacrylate) (PMMA), polycarbonate (PC), polyethersulfone (PES), polyamide (PA), poly(ethylene terephthalate) (PET), polyetheretherketone (PEEK), polyethylene naphthalate (PEN), polyethylenimine (PEI), polyurethane (PU), polydimethylsiloxane (PDMS), acrylic, ether series of polymers, polyolefin or a combination of two or more of the above, but not limited thereto. In other words, the carrier 10 may be a single organic material, a mixture of two organic materials or a mixture of multiple organic materials.

In other embodiments, the carrier 10 is made of a composite material. The carrier 10 includes an organic material and an inorganic material. The inorganic material may be distributed in the organic material in dots, stripes, networks, three-dimensional networks, or a combination thereof. The organic material is as that described above. Adding of the inorganic material may improve impact resistance capability of an impact-resistant shock-absorbing structure. The inorganic material may be silica, aluminum oxide, titanic oxide or a combination thereof, but not limited thereto. In one embodiment where the carrier 10 is made of the composite material (containing the organic material and the inorganic material) and the adopted inorganic material is silica, through dispersion reaction treatment of surface functional groups of the silica, the inorganic material may have a cross-linking reaction to form a network structure, so as to improve a compressive strength thereof. In certain embodiments, the dispersion reaction treatment is to use a catalyst to make the surface functional groups of the inorganic material to produce the cross-linking reaction. In certain embodiments, the catalyst may be acidic or alkaline. The acidic catalyst may be, for example, hydrochloric acid (HCl), sulfuric acid ($H_2SO_4$), nitric acid ($HNO_3$) and propenoic acid (or referred to as acrylic acid). The alkaline catalyst may be, for example, sodium hydroxide (NaOH) and aqueous ammonia ($NH_4OH$). Proper catalyst is applied according to different functional requirements, and in case of the acidic catalyst, a hydrolysis rate thereof is greater than a condensation rate, which is liable to form the network structure. In one embodiment, the carrier 10 includes regions R1, R2 and R3. The region R3 is between the region R1 and the region R2. In one embodiment, the region R1 is, for example, a system-in-package (SiP) region. In other words, a system-in-package structure is provided on the region R1. The system-in-package structure has various system-in-package functional devices of active/passive devices (including functional chips such as processors, memories, etc.) that can achieve a basic and complete function. The region R2 is, for example, a sensing region; and the region R3 is, for example, a trace connection region.

A first redistribution structure 20 is provided on the region R1 of the carrier 10. The first redistribution structure 20 includes one or more insulation layers 22 and one or more redistribution layers 24 located therein. In FIGS. 2A and 2B, two insulation layers 22a and 22b and two redistribution layers 24a and 24b are used for illustration, but the embodiment of the disclosure is not limited thereto. Each redistribution layer 24 includes a plurality of wires and a plurality of vias. The wires extend on a plane. The via may connect two of the wires which are longitudinally adjacent to each other. A material of the insulation layer 22 includes, for example, polymer, nitride, oxide, or a combination thereof. The polymer is, for example, polybenzoxazole (PBO), polyimide, benzocyclobutene (BCB), or a combination thereof. The nitride is, for example, silicon nitride. The oxide is, for example, silicon oxide, phosphosilicate glass (PSG), borosilicate glass (BSG), borophosphosilicate glass (BPSG), or a combination thereof. A material of the redistribution layer 24 includes a conductor, such as a metal or a metal alloy, which may be Al, Cu, Sn, Ni, Au, Ag, or other suitable conductive materials. The first redistribution structure 20 may be formed on the carrier 10 by means of attaching, laminating, sputtering, printing, electroplating, electroless plating, chemical vapor deposition CVD, and the like. The first redistribution structure 20 has a second thickness T2 and a second Young's modulus Y2. The second thickness T2 is less than the first thickness T1, and the second Young's modulus Y2 is greater than the first Young's modulus Y1. A range of the second thickness T2 is, for example, 0.13 mm to 6.5 mm. A range of the second Young's modulus Y2 is, for example, 25 GPa to 220 GPa.

In the embodiment where the application field is a wearable device, the carrier 10 is a flexible carrier such as polyimide, and the first redistribution structure 20 is formed in the flexible carrier and configured to cushion and absorb energy from collision to prevent the functional carrier from damages. It should be noted that, because human skin has about 0.22±0.047 Ns/m damping coefficient, the impact may be further reduced to the lowest.

One or more devices 30 are disposed on the first redistribution structure 20. The device 30 may be a die. The die may be composed of one or more active and/or passive devices. The die is, for example, an application-specific integrated circuit (ASIC) chips, an analog chips a sensor chip, a wireless and radio frequency chip, a voltage regulator chip, a voltage regulator chip or a memory chip. The device 30 may also be a stacked die, a package structure, a stacked package-on-packages (PoP), a package-in-package (PiP), and a system-in-package (SiP). The device 30 may be bonded to the first redistribution structure 20 by using an anisotropic conductive adhesive (ACA), an anisotropic conductive film (ACF), an anisotropic conductive paste (ACP), a photosensitive resist, an adhesive tape, a solder paste, or a combination thereof. The device 30 may be electrically connected to the redistribution layer 24 of the first redistribution structure 20. In one embodiment, the device 30 includes devices 30a, 30b and 30c, but not limited thereto. Among the devices 30a, 30b and 30c, the height of the device 30a is the highest, and the height of the device 30c is the lowest. In FIGS. 2A and 2B, the device 30a is disposed between the devices 30b and 30c. However, the disclosure is not limited in this regard. The device 30a with the highest height may be disposed at any location in the region R1.

Electrodes 72 and 74 are provided in the region R2 of the carrier 10. In certain embodiments, bottom surfaces of the electrodes 72 and 74 are exposed without being covered by the carrier 10. A material of the electrodes 72 and 74 includes a conductor material, such as a metal or a metal alloy, which may be Al, Cu, Sn, Ni, Au, Ag, or other suitable conductive materials.

A second redistribution structure 40 is provided on the region R2 of the carrier 10. The second redistribution structure 40 includes one or more insulation layers 42 and one or more redistribution layers 44 located therein. In FIGS. 2A and 2B, two insulation layers 42a and 42b and two redistribution layers 44a and 44b are used for illustration, but the embodiment of the disclosure is not limited thereto. The redistribution layer 44 is electrically connected to the electrodes 72 and 74. Each redistribution layer 44 includes a plurality of wires and a plurality of vias. The wires extend on a plane. The via may connect two of the wires which are longitudinally adjacent to each other. A material of the insulation layer 42 includes, for example, polybenzoxazole (PBO), polyimide, benzocyclobutene (BCB), nitride (such as silicon nitride, etc.), oxide (such as silicon oxide, etc.), phosphosilicate glass (PSG), borosilicate glass (BSG), borophosphosilicate glass (BPSG) or a combination thereof. A material of the redistribution layer 44 includes a conductor, such as a metal or a metal alloy, which may be Al, Cu, Sn, Ni, Au, Ag, or other suitable conductive materials. The second redistribution structure 40 may be formed on the carrier 10 by means of attaching, laminating, sputtering, printing, electroplating, electroless plating, chemical vapor deposition CVD, and the like.

One or more devices 50 are provided on the second redistribution structure 40 of the region R2. The device 50 may be a die. The dies are, for example, an application-specific integrated circuit (ASIC) chip, an analog chip, a sensor chip, a wireless and radio frequency chip, a voltage regulator chip, a voltage regulator chip or a memory chip. The devices 50 may also be a stacked die, a package structure, a stacked package-on-package (PoP), a package-in-package (PiP), and a system-in-package (SiP). The devices 50 may be bonded to the first redistribution structure 40 by using an anisotropic conductive adhesive (ACA), an anisotropic conductive film (ACF), an anisotropic conductive paste (ACP), a photosensitive resist, an adhesive tape, a solder paste, or a combination thereof, and electrically connected to the redistribution layer 44 of the second redistribution structure 40. The device 50 is a variety of sensing elements designed to meet the needs of various types of carriers and used to detect events or changes in the environment and send corresponding information to the device 30 (such as a SiP processor). In this embodiment, the device 50 is a sensing chip (or referred to as an FHE sensing chip). The sensing chip may be a gravity sensing chip, a temperature sensing chip, an electrocardiogram (ECG/EKG) sensor, a photoplethysmography (PPG) sensor, a blood pressure monitor, or other physiological data measurement sensor, or a combination of the above devices, but not limited thereto. In one embodiment, the sensing chip can at least sense various physiological signals such as heartbeat, respiration, blood pressure, body temperature, and body fat rate.

A trace structure 60 is provided on the region R3 of the carrier 10. The trace structure 60 is applicable to a flexible functional vehicle. In one embodiment, the trace structure 60 may be similar to the first redistribution structure 20 or the second redistribution structure 40. In other words, the trace structure 60 may include an insulation layer 62 and a plurality of traces 64, as shown in FIG. 2A. The traces 64 are formed in the insulation layer 62. A material of the insulation layer 62 may be similar to that of the insulation layer 22 or 42. The traces 64 include a conductive material which may be similar to that of the redistribution layer 24 or 44. The first redistribution structure 20, the second redistribution structure 40 and the trace structure 60 may be simultaneously formed on the carrier 10.

In another embodiment, the trace structure 60 includes the insulation layer 62 and the traces 64, as shown in FIG. 2B. The traces 64 are formed on the insulation layer 62, and each of the traces 64 has one end electrically connected to the redistribution layer 24 and another end electrically connected to the redistribution layer 44. The insulation layer 62 of the trace structure 60 may be simultaneously formed together with the insulation layers 22 and 42 of the first redistribution structure 20 and the second redistribution structure 40. The traces 64 of the trace structure 60 are formed on the insulation layer 62 after the first redistribution structure 20 and the second redistribution structure 40 are formed. The traces 64 of the trace structure 60 may be formed on the carrier 10 by printing, coating or laminating. The traces 64 may be electrically connected to the redistribution layers 24 and 44 by ultrasonic hot pressing or eutectic bonding.

Referring to FIG. 1, FIG. 2A and FIG. 2B, an encapsulation layer 70 covers the first redistribution structure and the device 30 on the region R1, the second redistribution structure 40 and the device 50 on the region R2 and the trace structure 60 on the region R3. The encapsulation layer 70 also laterally encapsulates the devices 30 and 50. The encapsulation layer 70 can protect the devices 30 and 50, and has the function of waterproofing to avoid or slow down materials and electrical characteristics of the components 30 and 50 from being changed due to external influences. In one embodiment, the encapsulation layer 70 may be a flexible packaging material. The encapsulation layer 70 includes a molding compound, a molding underfill, a resin (e.g., epoxy resin, or acrylic resin), a combination thereof or the like. In certain embodiments, the encapsulation layer 70 includes a photo-sensitive material, such as polybenzoxazole, polyimide, phencyclobutene, a combination thereof or the like, which may be patterned through exposure and developing. In an alternative embodiment, the encapsulation layer 70 includes nitride (e.g., silicon nitride), oxide (e.g., silicon oxide), PSG, BSG, BPSG, a combination thereof or the like. A formation method of the encapsulation layer 70 includes, for example, forming an encapsulation material layer on the carrier 10 by a spin coating method, a lamination method, a deposition method or the like so that the encapsulation material layer encapsulates a lateral surface and a top surface of the device 30.

In one embodiment, in the region R1, Young's modului of the devices 30a, 30b and 30c are between 100 GPa and 200 GPa (e.g., 165 GPa). Height ranges of the devices 30a, 30b and 30c are, for example, 0.05 mm to 2.5 mm. A range of Young's modulus of the encapsulation layer 70 is, for example, 0.05 GPa to 5 GPa. In the first redistribution structure 20, a range of a ratio of a volume of the redistribution layer 24 and a volume of the insulation layer 22 is, for example, 15% to 85%. A range of a volume of the device 30 and a volume of the encapsulation layer 70 is, for example, 3% to 30%. A range of Young's modulus of the entire SiP structure (including the devices 30a, 30b and 30c and the encapsulation layer 70) is, for example, 5 GPa to 85 GPa. A range of a total thickness Tt1 (i.e., T3+T4) of the entire SiP structure is 0.5 mm to 5.0 mm.

In one embodiment, in the region R2, the device 50 has Young's modulus of 165 GPa and a height lower than that of the device 30a. A range of the height of the device 50 is, for example, 0.05 m to 2.5 mm. A range of Young's modulus of the encapsulation layer 70 is, for example, 0.05 GPa to 5 GPa. In the second redistribution structure 40, a range of a ratio of a volume of the redistribution layer 44 and a volume of the insulation layer 42 is, for example, 25% to 85%. A range of a volume of the device 50 and a volume of the encapsulation layer 70 is, for example, 2.0% to 20%. A range of Young's modulus of the entire FHE sensor structure (including the device 50 and the encapsulation layer 70) is, for example, 10 GPa to 75 GPa. A range of a total thickness Tt2 of the entire FHE sensor structure (from a top surface of the second redistribution structure 40 to a top surface of the encapsulation layer 70) is, for example, 0.5 mm to 5.0 mm.

In one embodiment, referring to FIG. 2A, in the region R3, Young's modulus of the trace structure 60 is 10 GPa to 50 GPa. In the trace structure 60, a range of a ratio of a volume of the trace 64 and a volume of the insulation layer 62 is, for example, 15% to 50%. A range of a height H1 of the trace 64 is, for example, 0.008 mm to 0.08 mm. A range of Young's modulus of the encapsulation layer 70 is, for example, 0.05 GPa to 5 GPa. A range of a total thickness Tt3 of the region R3 (the trace connection region; from a top surface of the trace structure 60 to the top surface of the encapsulation layer 70) is, for example, 0.5 mm to 5.0 mm.

In one embodiment, referring to FIG. 2B, in the region R3, Young's modulus of the trace structure 60 is 10 GPa to 50 GPa. In the trace structure 60, a range of a ratio of a volume of the trace 64 and a volume of the insulation layer 62 is, for example, 15% to 50%. A range of a height H1 of the trace 64 is, for example, 0.008 mm to 0.08 mm. A range of Young's modulus of the encapsulation layer 70 is, for example, 0.05 GPa to 5 GPa. A range of a total thickness Tt3 of the region R3 (the trace connection region; from a top surface of the insulation layer 62 to the top surface of the encapsulation layer 70) is, for example, 0.5 mm to 5.0 mm.

In this embodiment, among the devices 30a, 30b and 30c and the device 50, a top surface 30t of the device 30a is the highest. When the flexible hybrid electronic system 100a encounters an external collision, the device 30a with the highest height is subjected to the most stress. If the stress cannot be released, the material of the internal electronic device of the device 30a may be damaged, resulting in device malfunction. Therefore, in the embodiment of the disclosure, components from a top surface 20t of the first redistribution structure 20 to the top surface 30t of the device 30a are defined as a first portion P1 of the flexible hybrid electronic system 100a, and components from the top surface 30t of the device 30a to a top surface 70t1 of the encapsulation layer 70 are defined as a second portion P2 of the flexible hybrid electronic system 100a. A mechanical strength of the flexible hybrid electronic system 100a may be controlled by changing and adjusting the thicknesses and Young's modului of the first portion P1, the second portion P2, the carrier 10 and the first redistribution structure 20. Here, the top surface 20t of the first redistribution structure 20 refers to a top surface of the insulation layer 22b which is the topmost layer of the first redistribution structure 20.

The first portion P1 has a third thickness T3 and a third Young's modulus Y3. The second portion P2 has a fourth thickness T4 and a fourth Young's modulus Y4. A range of the third thickness T3 is, for example, 0.05 mm to 2.5 mm. A range of the third Young's modulus Y3 is, for example, 5 GPa to 85 GPa. A range of the fourth thickness T4 is, for example, 0.5 mm to 3.8 mm. A range of the fourth Young's modulus Y4 is, for example, 0.05 GPa to 5.0 GPa.

In one embodiment, a ratio of Y3/Y4 is between 1.26 and 2.34; a ratio of Y3/Y2 is between 0.14 and 0.26; and a ratio of Y3/Y1 is between 218.26 and 405.34. A ratio of T3/T4 is between 1.54 and 2.86; a ratio of T3/T2 is between 1.82 and 3.38; and a ratio of T3/T1 is between 0.56 and 1.04.

In another embodiment, a ratio of Y3/Y4 is between 1.62 and 1.98; a ratio of Y3/Y2 is between 0.18 and 0.22; and a ratio of Y3/Y1 is between 280.62 and 342.98. A ratio of T3/T4 is between 1.98 and 2.42; a ratio of T3/T2 is between 2.34 and 2.86; and a ratio of T3/T1 is between 0.72 and 0.88.

In yet another embodiment, Y3/Y4 is approximately 1.8; Y3/Y2 is approximately 0.2; and Y3/Y1 is approximately 311.8. T3/T4 is approximately 2.2; T3/T2 is approximately 2.6; and T3/T1 is approximately 0.8.

By changing and adjusting Y3/Y4, Y3/Y1, Y3/Y2, T3/T4, T3/T2 and T3/T1 to the above ranges, the flexible hybrid electronic system 100a can have the effect of cushioning and absorbing energy, and the mechanical strength of the flexible hybrid electronic system 100a may be improved without the need to additionally add the impact-resistant shock-absorbing structure above the encapsulation layer 70 or below the carrier 10. Y3/Y4, Y3/Y1, Y3/Y2, T3/T4, T3/T2 and T3/T1 may be changed and adjusted by adopting various methods. In one embodiment, by changing and adjusting Y3/Y4, Y3/Y1, Y3/Y2, T3/T4, T3/T2 and T3/T1 to the above ranges, the flexible hybrid electronic system 100a can cushion and withstand an external impact of 0.46 to 7 J.

For instance, if Y3/Y4 is less than 1.26 when the flexible hybrid electronic system 100a is subjected to the external impact of 0.46 J to 7 J, although 92 to 99% of the impact force may be cushioned, the effect of system flexibility will be reduced. For example, the curvature radius increases from 7.5 mm to 10 mm, which will be detrimental to the application of wearable devices, for example. When Y3/Y4 is greater than 2.34, the external impact of 0.46 J to 7 J will only be cushioned by 85 to 90%, and the remaining 10 to 15% of the impact force will be distributed inside the system or diffused in the form of heat. In this case, if Y3/Y2 is less than 0.14 or greater than 0.26 and Y3/Y1 is less than 218.26 or greater than 405.34, the system damage will be further accelerated.

For instance, if T3/T4 is less than 1.54 when the flexible hybrid electronic system 100a is subjected to the external impact of 0.46 J to 7 J, although 95 to 99% of the impact force may be cushioned, the effect of system flexibility will be reduced. For example, the curvature radius increases from 7.5 mm to 12 mm, which will be detrimental to the application of wearable devices, for example. When T3/T4 is greater than 2.86, the external impact of 0.46 J to 7 J will only be cushioned by 85 to 90%, and the remaining 10 to 15% of the impact force will be distributed inside the system or diffused in the form of heat. In this case, if T3/T2 is less than 1.86 or greater than 3.38 and T3/T1 is less than 0.56 or greater than 1.04, the system damage will be further accelerated.

Figure 3:
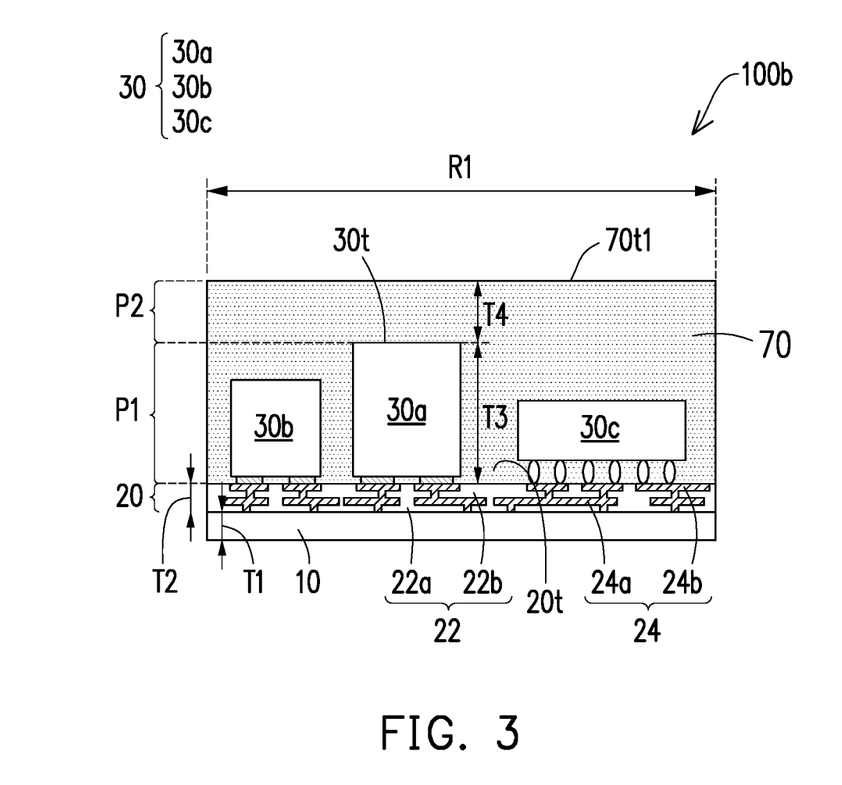
Figure 4:
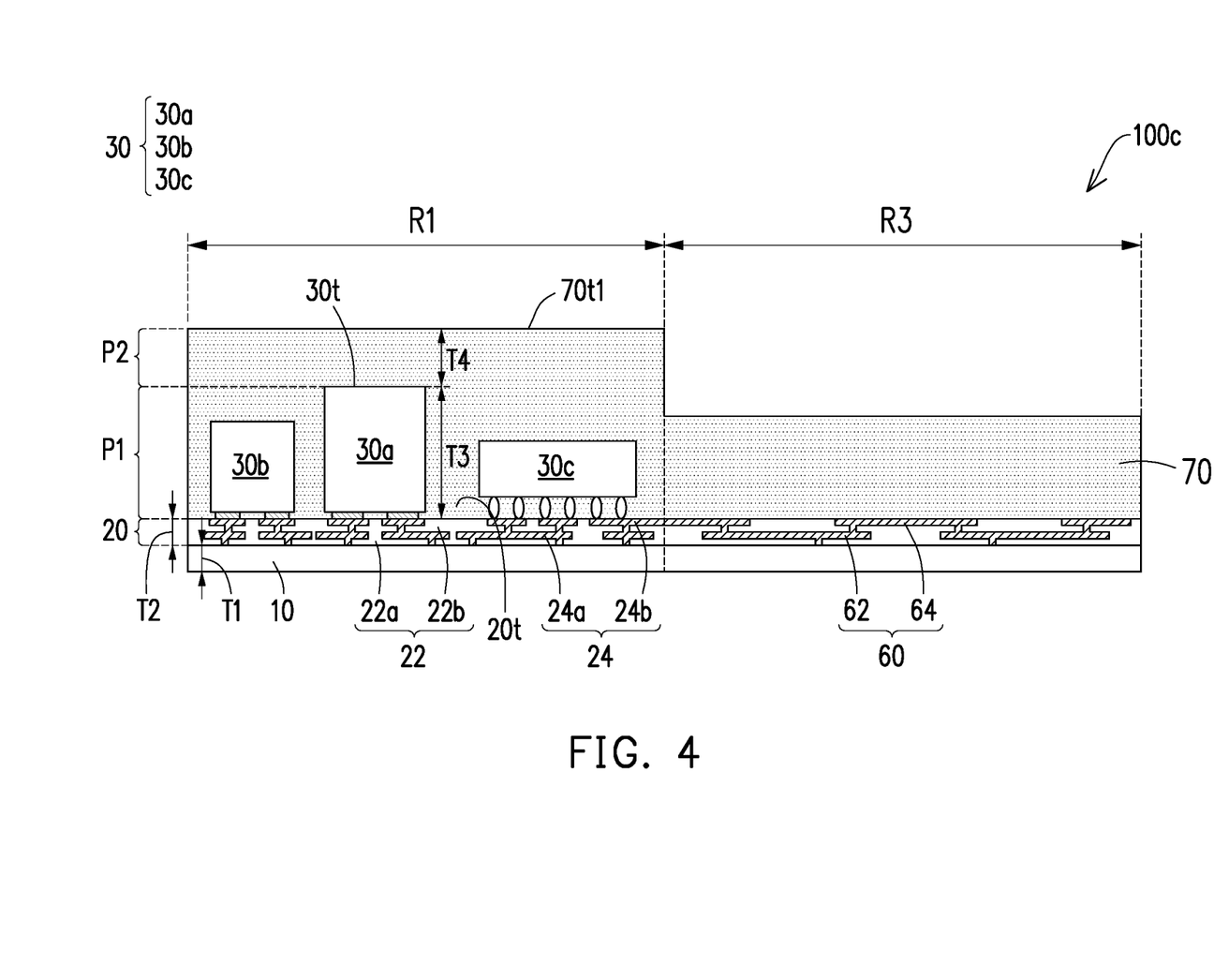

The flexible hybrid electronic system may have various structures or configurations. In one embodiment, the carrier 10 of a flexible hybrid electronic system 100b includes the region R1, but does not include the regions R2 and R3, as shown in FIG. 3. In another embodiment, the carrier 10 of a flexible hybrid electronic system 100c includes the regions R1 and R3, but does not include the region R2, as shown in FIG. 4. In yet another embodiment, the carrier 10 of a flexible hybrid electronic system 100d includes the regions R1 and R2, but does not include the region R3. Further, the redistribution layer 24 on the region R1 is electrically connected to the redistribution layer 44 on the region R2, as shown in FIG. 5.

Figure 5:
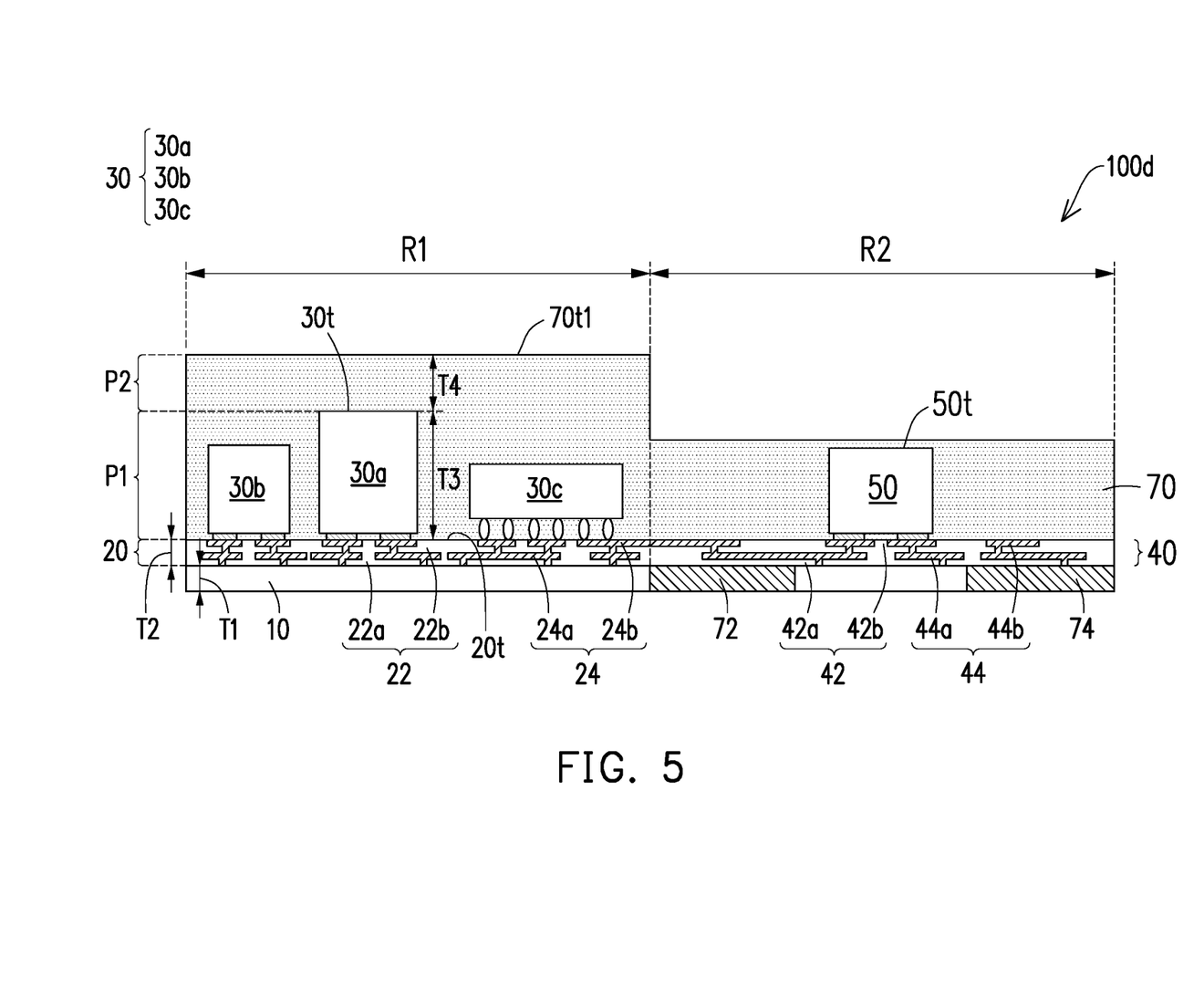

Referring to the embodiments of FIG. 3 to FIG. 5, among the flexible hybrid electronic systems 100b, 100c and 100d, except for the encapsulation layer 70, the top surface 30t of the device 30 is still the highest top surface on the carrier 10. By changing and adjusting Y3/Y4, Y3/Y1, Y3/Y2, T3/T4, T3/T2 and T3/T1, the mechanical strength of the flexible hybrid electronic system may be improved without the need to additionally add the impact-resistant shock-absorbing structure above the encapsulation layer 70 or below the carrier 10. In one embodiment, a ratio of Y3/Y4 is between 1.26 and 2.34; a ratio of Y3/Y2 is between 0.14 and 0.26; and a ratio of Y3/Y1 is between 218.26 and 405.34. A ratio of T3/T4 is between 1.54 and 2.86; a ratio of T3/T2 is between 1.82 and 3.38; and a ratio of T3/T1 is between 0.56 and 1.04. In another embodiment, a ratio of Y3/Y4 is between 1.62 and 1.98; a ratio of Y3/Y2 is between 0.18 and 0.22; and a ratio of Y3/Y1 is between 280.62 and 342.98. A ratio of T3/T4 is between 1.98 and 2.42; a ratio of T3/T2 is between 2.34 and 2.86; and a ratio of T3/T1 is between 0.72 and 0.88. In yet another embodiment, Y3/Y4 is approximately 1.8; Y3/Y2 is approximately 0.2; and Y3/Y1 is approximately 311.8. T3/T4 is approximately 2.2; T3/T2 is approximately 2.6; and T3/T1 is approximately 0.8.

Figure 6:
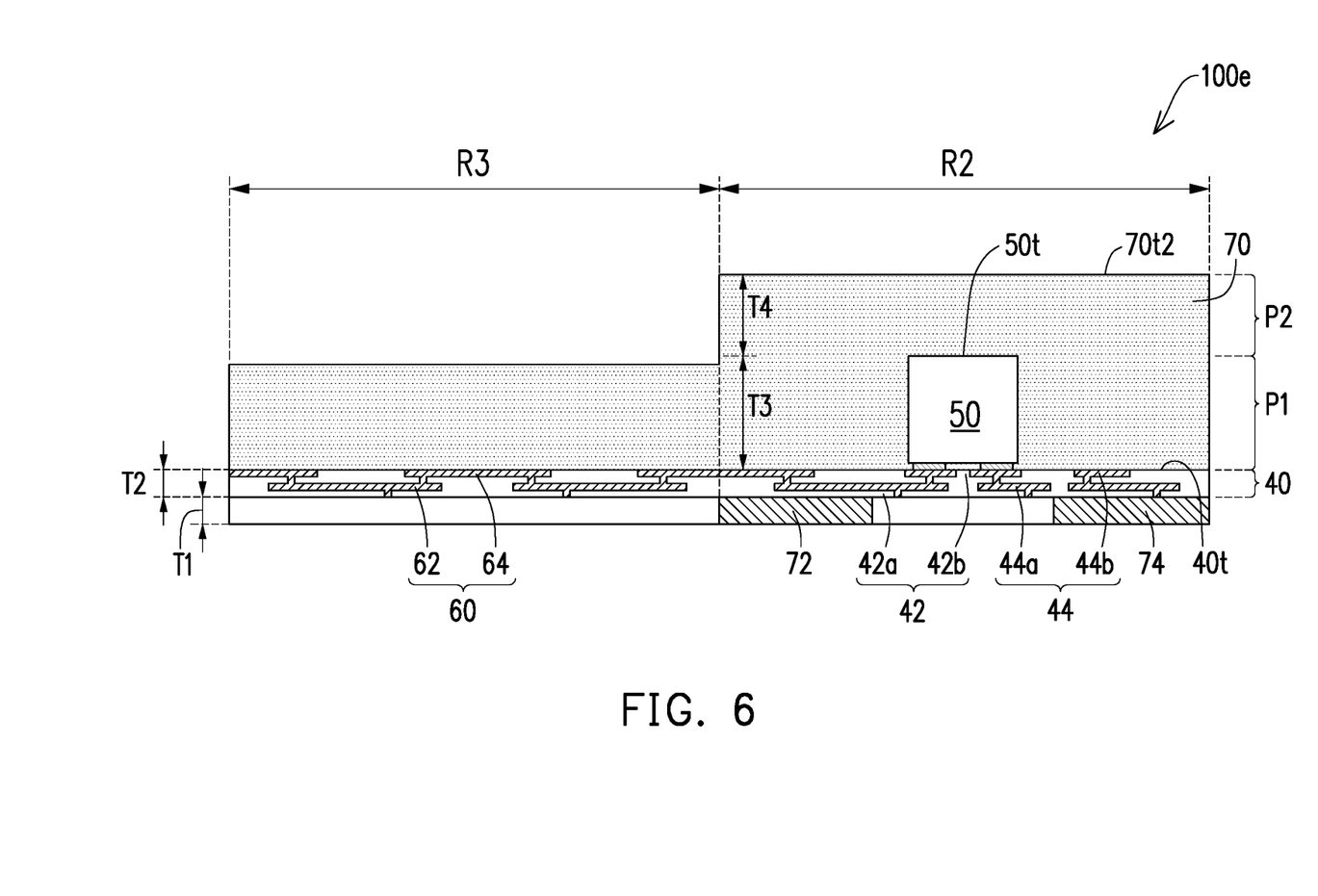

For another flexible hybrid electronic system 100e, as shown in FIG. 6, the carrier 10 includes the regions R2 and R3, but does not include the region R1. In this embodiment, the electrodes 72 and 74 are provided in the region R2 of the carrier 10. Accordingly, the carrier 10 of the region R1 is replaced by a combination of the carrier 10 and the electrodes 72 and 74 in the carrier 10. That is, a combined structure of the carrier 10 and the electrodes 72 and 74 has its thickness defined as T1 and has the first Young's modulus Y1. A range of the first thickness T1 is, for example, 1.25 mm to 3.12 mm. A range of the first Young's modulus Y1 is, for example, 0.02 GPa to 0.27 GPa.

In addition, the first redistribution structure 20 is replaced by the second redistribution structure 40. That is, the second redistribution structure 40 has a thickness of T2, and has the second Young's modulus Y2. The second thickness T2 is less than the first thickness T1, and the second Young's modulus Y2 is greater than the first Young's modulus Y1. A range of the second thickness T2 is, for example, 0.13 mm to 6.5 mm. A range of the second Young's modulus Y2 is, for example, 25 GPa to 220 GPa.

Since the device 30 is no longer on the carrier 10, the device 50 is used as a replacement of the device 30 to regulate various thickness ratios and Young's modulus ratios. That is, the first portion P1 and the second portion P2 are defined with the top surface 30t of the device 30 replaced by a top surface 50t of the device 50 and the first redistribution structure 20 replaced by the second redistribution structure 40.

Components from a top surface 40t of the second redistribution structure 40 to the top surface 50t of the device 50 are defined as the first portion P1 of the flexible hybrid electronic system 100e, and components from the top surface 50t of the device 50 to a top surface 70t2 of the encapsulation layer 70 are defined as the second portion P2 of the flexible hybrid electronic system 100e. A mechanical strength of the flexible hybrid electronic system 100e may be controlled by changing and adjusting the thicknesses and Young's modului of the first portion P1, the second portion P2, the carrier 10 and the second redistribution structure 40. Here, the top surface 40t of the second redistribution structure 40 refers to a top surface of the insulation layer 42b which is the topmost layer of the second redistribution structure 40. The first portion P1 has a third thickness T3 and a third Young's modulus Y3. The second portion P2 has a fourth thickness T4 and a fourth Young's modulus Y4. A range of the third thickness T3 is, for example, 0.05 mm to 2.5 mm. A range of the third Young's modulus Y3 is, for example, 5 GPa to 85 GPa. A range of the fourth thickness T4 is, for example, 0.5 mm to 3.8 mm. A range of the fourth Young's modulus Y4 is, for example, 0.05 GPa to 5.0 GPa.

In one embodiment, a ratio of Y3/Y4 is between 1.26 and 2.34; a ratio of Y3/Y2 is between 0.14 and 0.26; and a ratio of Y3/Y1 is between 218.26 and 405.34. A ratio of T3/T4 is between 1.54 and 2.86; a ratio of T3/T2 is between 1.82 and 3.38; and a ratio of T3/T1 is between 0.56 and 1.04. In another embodiment, a ratio of Y3/Y4 is between 1.62 and 1.98; a ratio of Y3/Y2 is between 0.18 and 0.22; and a ratio of Y3/Y1 is between 280.62 and 342.98. A ratio of T3/T4 is between 1.98 and 2.42; a ratio of T3/T2 is between 2.34 and 2.86; and a ratio of T3/T1 is between 0.72 and 0.88. In yet another embodiment, Y3/Y4 is approximately 1.8; Y3/Y2 is approximately 0.2; and Y3/Y1 is approximately 311.8. T3/T4 is approximately 2.2; T3/T2 is approximately 2.6; and T3/T1 is approximately 0.8.

By changing and adjusting Y3/Y4, Y3/Y1, Y3/Y2, T3/T4, T3/T2 and T3/T1, the mechanical strength of the flexible hybrid electronic system 100e may be improved without the need to additionally add the impact-resistant shock-absorbing structure above the encapsulation layer 70 or below the carrier 10. Y3/Y4, Y3/Y1, Y3/Y2, T3/T4, T3/T2 and T3/T1 may be changed and adjusted by adopting various methods. In one embodiment, by changing and adjusting Y3/Y4, Y3/Y1, Y3/Y2, T3/T4, T3/T2 and T3/T1 to the above ranges, the flexible hybrid electronic system 100e can cushion and withstand an external impact of 0.46 to 7 J.

For instance, if Y3/Y4 is less than 1.26 when the flexible hybrid electronic system 100e is subjected to the external impact of 0.46 J, although 92 to 99% of the impact force may be cushioned, the effect of system flexibility will be reduced. For example, the curvature radius increases from 7.5 mm to 10 mm, which will be detrimental to the application of wearable devices, for example. When Y3/Y4 is greater than 2.34, the external impact of 0.46 J will only be cushioned by 85 to 90%, and the remaining 10 to 15% of the impact force will be distributed inside the system or diffused in the form of heat. In this case, if Y3/Y2 is less than 0.14 or greater than 0.26 and Y3/Y1 is less than 218.26 or greater than 405.34, the system damage will be further accelerated.

For instance, if T3/T4 is less than 1.54 when the flexible hybrid electronic system 100e is subjected to the external impact of 0.46 J, although 95 to 99% of the impact force may be cushioned, the effect of system flexibility will be reduced. For example, the curvature radius increases from 7.5 mm to 12 mm, which will be detrimental to the application of wearable devices, for example. When T3/T4 is greater than 2.86, the external impact of 0.46 J will only be cushioned by 85 to 90%, and the remaining 10 to 15% of the impact force will be distributed inside the system or diffused in the form of heat. In this case, if T3/T2 is less than 1.86 or greater than 3.38 and T3/T1 is less than 0.56 or greater than 1.04, the system damage will be further accelerated.

For instance, in the case where the application field is a multifunctional seat for car (which is integrated with the flexible hybrid electronic system 100e), after suffering a recoil impact of 5 J from the emergency braking when Y3/Y4 is less than 1.26, although the impact can be cushioned by 85 to 90%, the effect of seat comfort is reduced and the driver is prone to injury. When Y3/Y4 is greater than 2.34, the external impact of 5 J will only be cushioned by 75 to 84%, and the remaining 25 to 16% of the impact force will be distributed inside the system or diffused in the form of heat. In this case, if Y3/Y2 is less than 0.14 or greater than 0.26 and Y3/Y1 is less than 218.26 or greater than 405.34, the system damage will be further accelerated.

When Y3/Y4, Y3/Y1, Y3/Y2, T3/T4, T3/T2 and T3/T1 of the flexible hybrid electronic systems 100a to 100e cannot be adjusted to the above ranges, the impact-resistant shock-absorbing structure may be additionally added above the encapsulation layer 70 or within the encapsulation layer 70, as described below with reference to the embodiments of FIG. 7 and FIG. 8.

Figure 7:
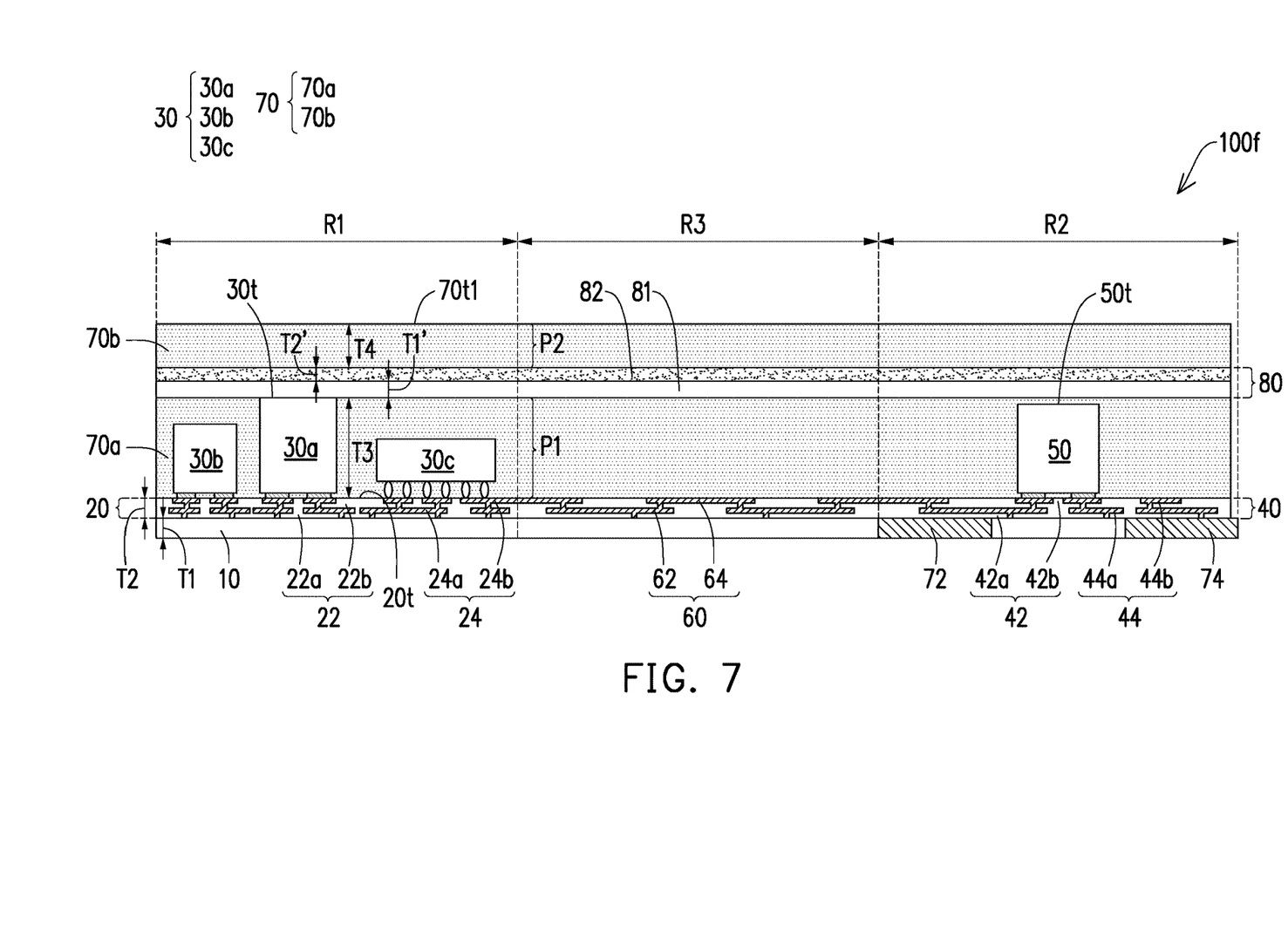

Referring to FIG. 7, a structure of a flexible hybrid electronic system 100f is similar to that of the flexible hybrid electronic system 100a but differs in that the impact-resistant shock-absorbing structure is inserted in the encapsulation layer 70. In other words, an impact-resistant shock-absorbing structure 80 is inserted between the first portion P1 and the second portion P2 of the encapsulation layer 70. In certain embodiments, the impact-resistant shock-absorbing structure 80 includes a first material layer 81 and a second material layer 82, but not limited thereto. The first material layer 81 covers a portion of an encapsulation layer 70a on the region R1 and contacts the top surface 30t of the device 30a on the region R1. Also, the first material layer 81 further covers a portion of the encapsulation layer 70a (also referred to as a first encapsulation layer) on the regions R2 and R3.

The first material layer 81 has a first thickness T1' and has a first Young's modulus Y1'. The second material layer 82 has a second thickness T2' and has a second Young's modulus Y2'. The second thickness T2' of the second material layer 82 is less than the first thickness T1' of the first material layer 81, and the second Young's modulus Y2' is greater than the first Young's modulus Y1'. In one embodiment, a range of the first thickness T1' is, for example, 1.25 mm to 3.12 mm; A range of the first Young's modulus Y1' is, for example, 0.02 GPa to 0.27 GPa. A range of the second thickness T2' is, for example, 0.13 mm to 6.5 mm. A range of the second Young's modulus Y2' is, for example, 25 GPa to 220 GPa.

In one embodiment, a material of the first material layer 81 is, for example, polymer such as silicone rubber, rubber, butadiene acrylonitrile and the like. A material of the second material layer 82 may be composed of a hard substance that is not easily deformed, including materials like polymethyl methacrylate (PMMA), metal, glass, stainless steel and the like. The first material layer 81 and the second material layer 82 may be sequentially formed on the carrier 10. In another embodiment, the first material layer 81 and the second material layer 82 may be formed into the impact-resistant shock-absorbing structure 80 in advance, and then formed onto a surface of the encapsulation layer 70a and the top surface 30t of the device 30 by a bonding method.

After the impact-resistant shock-absorbing structure 80 is formed, a remaining portion of the encapsulation layer (also referred to as a second encapsulation layer) 70b may then be formed.

In this embodiment, components from the top surface 20t of the first redistribution structure 20 to the top surface 30t of the device 30a are defined as the first portion P1 of the flexible hybrid electronic system 100f, and the encapsulation layer 70b is defined as the second portion P2 of the flexible hybrid electronic system 100f. A mechanical strength of the flexible hybrid electronic system 100f may be controlled by changing and adjusting the thicknesses and Young's modului of the first portion P1, the second portion P2 and the impact-resistant shock-absorbing structure 80. Here, the top surface 20t of the first redistribution structure 20 refers to a top surface of the insulation layer 22b which is the topmost layer of the first redistribution structure 20.

The first portion P1 has a third thickness T3 and a third Young's modulus Y3. The second portion P2 has a fourth thickness T4 and a fourth Young's modulus Y4. A range of the third thickness T3 is, for example, 0.05 mm to 2.5 mm. A range of the third Young's modulus Y3 is, for example, 5 GPa to 85 GPa. A range of the fourth thickness T4 is, for example, 0.5 mm to 3.8 mm. A range of the fourth Young's modulus Y4 is, for example, 0.05 GPa to 5.0 GPa.

In one embodiment, a ratio of Y3/Y4 is between 1.26 and 2.34; a ratio of Y3/Y2' is between 0.14 and 0.26; and a ratio of Y3/Y1' is between 218.26 and 405.34; a ratio of T3/T4 is between 1.54 and 2.86; a ratio of T3/T2' is between 1.82 and 3.38; and a ratio of T3/T1' is between 0.56 and 1.04. In another embodiment, a ratio of Y3/Y4 is between 1.62 and 1.98; a ratio of Y3/Y2' is between 0.18 and 0.22; and a ratio of Y3/Y1' is between 280.62 and 342.98. A ratio of T3/T4 is between 1.98 and 2.42; a ratio of T3/T2' is between 2.34 and 2.86; and a ratio of T3/T1' is between 0.72 and 0.88. In yet another embodiment, Y3/Y4 is approximately 1.8; Y3/Y2' is approximately 0.2; and Y3/Y1' is approximately 311.8. T3/T4 is approximately 2.2; T3/T2' is approximately 2.6; and T3/T1' is approximately 0.8.

When Y3/Y1, Y3/Y2, T3/T4, T3/T2 and T3/T1 of the flexible hybrid electronic systems 100f cannot be changed and adjusted to the required ranges, the mechanical strength of the flexible hybrid electronic system 100f may be improved by disposing the impact-resistant shock-absorbing structure 80, and changing and adjusting Y3/Y4, Y3/Y1', Y3/Y2', T3/T4, T3/T2' and T3/T1'. Y3/Y4, Y3/Y1', Y3/Y2', T3/T4, T3/T2' and T3/T1' may be changed and adjusted by adopting various methods.

For instance, if Y3/Y4 is less than 1.26 when the flexible hybrid electronic system 100f is subjected to the external impact of 0.46 J, although 92 to 99% of the impact force may be cushioned, the effect of system flexibility will be reduced. For example, the curvature radius increases from 7.5 mm to 10 mm, which will be detrimental to the application of wearable devices, for example. When Y3/Y4 is greater than 2.34, the external impact of 0.46 J will only be cushioned by 85 to 90%, and the remaining 10 to 15% of the impact force will be distributed inside the system or diffused in the form of heat. In this case, if Y3/Y2' is less than 0.14 or greater than 0.26 and Y3/Y1' is less than 218.26 or greater than 405.34, the system damage will be further accelerated. When T3/T4 is greater than 2.86, the external impact of 0.46 J will only be cushioned by 85 to 90%, and the remaining 10 to 15% of the impact force will be distributed inside the system or diffused in the form of heat. In this case, if T3/T2' is less than 1.86 or greater than 3.38 and T3/T1' is less than 0.56 or greater than 1.04, the system damage will be further accelerated.

Figure 8:
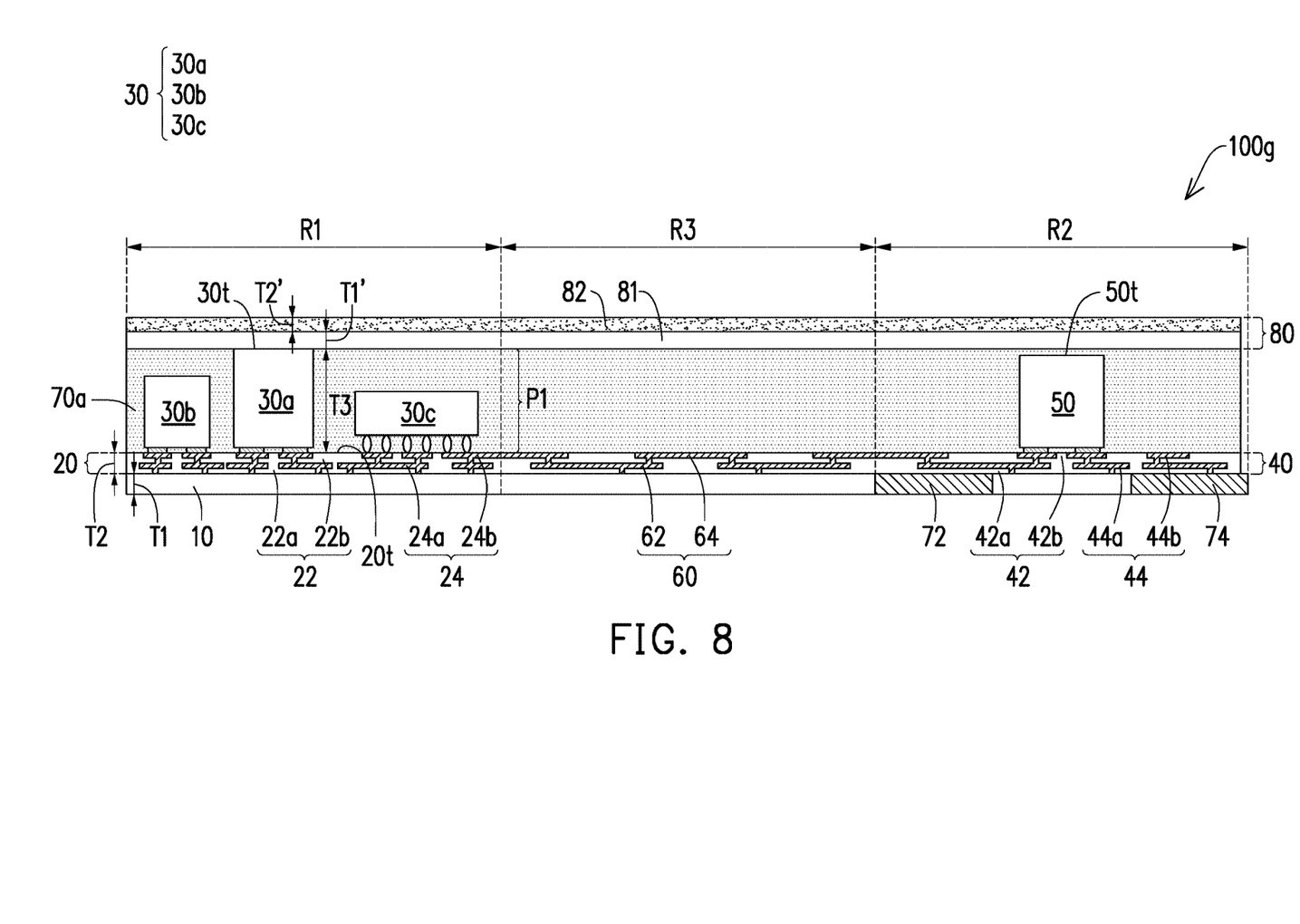

A flexible hybrid electronic system 100g shown in FIG. 8 is similar to the flexible hybrid electronic system 100f shown in FIG. 7 but differs in that the encapsulation layer (also referred to as the second encapsulation layer) 70b is omitted. The flexible hybrid electronic system 100g is applicable in some cases where the collision energy is lower (such as 0.46 to 1 J energy) or the possibility of collision is lower. Therefore, not only the encapsulation layer may be omitted, the effect of impact buffering may also be achieved.

In one embodiment, a ratio of Y3/Y2' is between 0.14 and 0.26; a ratio of Y3/Y1' is between 218.26 and 405.34; a ratio of T3/T2' is between 1.82 and 3.38; and a ratio of T3/T1' is between 0.56 and 1.04. In another embodiment, a ratio of Y3/Y2' is between 0.18 and 0.22; a ratio of Y3/Y1' is between 280.62 and 342.98; a ratio of T3/T2' is between 2.34 and 2.86; and a ratio of T3/T1' is between 0.72 and 0.88. In yet another embodiment, Y3/Y2' is approximately 0.2; Y3/Y1' is approximately 311.8. T3/T2' is approximately 2.6; and T3/T1' is approximately 0.8.

In each of the foregoing embodiments, the trace structure 60 of the region R3 is represented similar to the trace structure 60 of FIG. 2A, however, it may also be the trace structure 60 of FIG. 2B. Furthermore, in the foregoing embodiments, the encapsulation layer 70a may be planarized, as shown in FIG. 7 and FIG. 8. In other embodiments, the encapsulation layer 70a may not be planarized. The material layers 81 and 82 and the encapsulation layer 70b may be conformally covered on the encapsulation layer 70a (not illustrated).

According to an embodiment of the disclosure, by changing and adjusting the thicknesses and the Young's modului for of layers in the flexible hybrid electronic system and their ratio relationship, the flexible hybrid electronic system can have the effect of cushioning and absorbing energy. The mechanical strength may be improved without the need to additionally add the shock-resistant shock-absorbing structure. In another embodiment of the disclosure, by disposing the impact-resistant shock-absorbing structure and changing and adjusting the thicknesses and the Young's modului for of layers in the flexible hybrid electronic system and their ratio relationship, the flexible hybrid electronic system can have a greater mechanical strength as well as the effect of cushioning and absorbing energy, so as to reduce or avoid damages or malfunction on the flexible hybrid electronic system due to the external impact.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A flexible hybrid electronic system, comprising:
a first redistribution structure, disposed on a first region of a carrier, wherein the carrier has a first thickness T1 and a first Young's modulus Y1, and the first redistribution structure has a second thickness T2 and a second Young's modulus Y2;
a first device, disposed on the first redistribution structure; and
an encapsulation layer, encapsulating the first device, and covering the first device and the first redistribution structure, wherein
the first device and a portion of the encapsulation layer from a top surface of the first redistribution structure to a top surface of the first device is a first portion having a third thickness T3 and having a third Young's modulus Y3,
another portion of the encapsulation layer from the top surface of the first device to a top surface of the encapsulation layer is a second portion having a fourth thickness T4 and having a fourth Young's modulus Y4, wherein
a ratio of Y3/Y4 is between 1.62 and 1.98;
a ratio of Y3/Y2 is between 0.18 and 0.22; and
a ratio of Y3/Y1 is between 280.62 and 342.98.

2. The flexible hybrid electronic system according to claim 1, wherein
a ratio of T3/T4 is between 1.98 and 2.42;
a ratio of T3/T2 is between 2.34 and 2.86; and
a ratio of T3/T1 is between 0.72 and 0.88.

3. The flexible hybrid electronic system according to claim 1, wherein the first device is a device having a highest top surface among at least one device on the carrier.

4. The flexible hybrid electronic system according to claim 3, wherein the first region is a system-in-package region.

5. The flexible hybrid electronic system according to claim 4, further comprises:
a trace structure, disposed on a second region of the carrier, covered by the encapsulation layer and electrically connected to the first redistribution structure.

6. The flexible hybrid electronic system according to claim 4, further comprises:
a second redistribution structure, disposed on a second region of the carrier, and electrically connected to the first redistribution structure;
a sensing device, disposed on the second redistribution structure, wherein a top surface of the sensing device is lower in height than the top surface of the first device, and encapsulated and covered by the encapsulation layer; and
a plurality of electrodes, disposed in the carrier, and electrically connected to the sensing device.

7. The flexible hybrid electronic system according to claim 6, wherein the sensing device comprises a gravity sensing device.

8. The flexible hybrid electronic system according to claim 6, further comprises:
a trace structure, disposed on a third region of the carrier, covered by the encapsulation layer and electrically connected to the first redistribution structure and the second redistribution structure.

9. The flexible hybrid electronic system according to claim 1, wherein the first device comprises a sensing device, and further comprises a plurality of electrodes disposed in the carrier and electrically connected to the sensing device.

10. The flexible hybrid electronic system according to claim 9, further comprises:
a trace structure, disposed on a second region of the carrier, electrically connected to the first redistribution structure, and covered by the encapsulation layer.

11. A flexible hybrid electronic system, comprising:
a first redistribution structure, disposed on a first region of a carrier;
a first device, disposed on the first redistribution structure;
a first encapsulation layer, encapsulating the first device, and covering the first device and the first redistribution structure;
a first material layer, covering the first encapsulation layer and the first device, the first material layer having a first thickness T1' and a first Young's modulus Y1'; and
a second material layer, covering the first material layer, the second material layer having a second thickness T2' and a second Young's modulus Y2',
wherein the first device and a portion of the first encapsulation layer from a top surface of the first redistribution structure to a top surface of the first device is a first portion, and the first portion has a third thickness T3 and has a third Young's modulus Y3,
wherein
a ratio of Y3/Y2' is between 0.18 and 0.22;
a ratio of Y3/Y1' is between 280.62 and 342.98;
a ratio of T3/T2' is between 2.34 and 2.86; and
a ratio of T3/T1' is between 0.72 and 0.88.

12. The flexible hybrid electronic system according to claim 11, further comprises: a second encapsulation layer, covering the second material layer, wherein the second encapsulation layer has a fourth thickness T4 and has a fourth Young's modulus Y4; a ratio of Y3/Y4 is between 1.62 and 1.98; a ratio of T3/T4 is between 1.98 and 2.42.

13. The flexible hybrid electronic system according to claim 11, wherein the first device is a device having a highest top surface among at least one device on the carrier.

14. The flexible hybrid electronic system according to claim 13, wherein the first region is a system-in-package region.

15. The flexible hybrid electronic system according to claim 14, further comprises:
a second redistribution structure, disposed on a second region of the carrier, and electrically connected to the first redistribution structure;
a sensing device, disposed on the second redistribution structure, wherein a top surface of the sensing device is lower in height than the top surface of the first device, and encapsulated and covered by the encapsulation layer; and
a plurality of electrodes, disposed in the carrier, and electrically connected to the sensing device.

16. The flexible hybrid electronic system according to claim 15, further comprises:
a trace structure, disposed on a third region of the carrier, covered by the encapsulation layer and electrically connected to the first redistribution structure and the second redistribution structure.

17. The flexible hybrid electronic system according to claim 14, further comprises:
a trace structure, disposed on a second region of the carrier, covered by the encapsulation layer and electrically connected to the first redistribution structure.

18. A method of reducing impact of a flexible hybrid electronic system, wherein the flexible hybrid electronic system comprises:
at least one device, disposed on a plurality of regions of a carrier; a plurality of redistribution structures, respectively disposed between the carrier and the at least one device;
and an encapsulation layer, encapsulating the at least one device, and covering the at least one device and the redistribution structures,
the method comprises:
using a first device having a highest top surface among the at least one device as a reference, wherein the carrier below the first device has a first thickness T1 and a first Young's modulus Y1, and a first redistribution structure between the first device and the carrier has a second thickness T2 and a second Young's modulus Y2;
defining the first device and a portion of the encapsulation layer from a top surface of the first redistribution structure to a top surface of the first device as a first portion, the first portion having a third thickness T3 and having a third Young's modulus Y3;
defining another portion of the encapsulation layer from the top surface of the first device to a top surface of the encapsulation layer as a second portion, the second portion having a fourth thickness T4 and having a fourth Young's modulus Y4;
adjusting Y1, Y2, Y3 and Y4 so that
a ratio of Y3/Y4 is between 1.62 and 1.98;
a ratio of Y3/Y2 is between 0.18 and 0.22; and
a ratio of Y3/Y1 is between 280.62 and 342.98; and
adjusting T1, T2, T3 and T4 so that
a ratio of T3/T4 is between 1.98 and 2.42;
a ratio of T3/T2 is between 2.34 and 2.86; and
a ratio of T3/T1 is between 0.72 and 0.88.

19. The method of reducing impact of the flexible hybrid electronic system according to claim 18, further comprising:
when Y3/Y2, Y3/Y1, T3/T2 or T3/T1 is unable to be adjusted to the above ranges,
inserting a first material layer and a second material layer in the first portion and the second portion, wherein
the first material layer covers the first portion, and the first material layer has a first thickness T1' and a first Young's modulus Y1';
the second material layer covers the first material layer, and the second material layer has a second thickness T2' and a second Young's modulus Y2', and
adjusting Y1', Y2', T1' and T2' so that
a ratio of Y3/Y2' is between 0.18 and 0.22;
a ratio of Y3/Y1' is between 280.62 and 342.98;
a ratio of T3/T2' is between 2.34 and 2.86; and
a ratio of T3/T1' is between 0.72 and 0.88.

20. The method of reducing impact of the flexible hybrid electronic system according to claim 18, further comprising:
when Y3/Y2, Y3/Y1, T3/T2 or T3/T1 is unable to be adjusted to the above ranges,
disposing a first material layer and a second material layer on the first portion to replace the second portion, wherein
the first material layer covers the first portion, and the first material layer has a first thickness T1' and a first Young's modulus Y1';
the second material layer covers the first material layer, and the second material layer has a second thickness T2' and a second Young's modulus Y2', and
adjusting Y1', Y2', T1' and T2' so that
a ratio of Y3/Y2' is between 0.18 and 0.22;
a ratio of Y3/Y1' is between 280.62 and 342.98;
a ratio of T3/T2' is between 2.34 and 2.86; and
a ratio of T3/T1' is between 0.72 and 0.88.

* * * * *